(12) United States Patent
Poveda

(10) Patent No.: US 11,664,367 B2
(45) Date of Patent: *May 30, 2023

(54) PROTECTION AGAINST ELECTROSTATIC DISCHARGES AND FILTERING

(71) Applicant: STMicroelectronics (Tours) SAS, Tours (FR)

(72) Inventor: Patrick Poveda, Villedomer (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/717,501

(22) Filed: Apr. 11, 2022

(65) Prior Publication Data

US 2022/0238507 A1 Jul. 28, 2022

Related U.S. Application Data

(63) Continuation of application No. 16/359,431, filed on Mar. 20, 2019, now Pat. No. 11,329,040.

(30) Foreign Application Priority Data

Mar. 26, 2018 (FR) ..................................... 1852593

(51) Int. Cl.
*H02H 9/00* (2006.01)
*H01L 27/02* (2006.01)
(Continued)

(52) U.S. Cl.
CPC ........ *H01L 27/0248* (2013.01); *H01L 23/528* (2013.01); *H01L 23/5227* (2013.01);
(Continued)

(58) Field of Classification Search
None
See application file for complete search history.

(56) References Cited

U.S. PATENT DOCUMENTS 3,684,898 A * 8/1972 Wood ..................... H03K 17/72
327/447
9,735,291 B1 8/2017 Chiou et al.
(Continued)

FOREIGN PATENT DOCUMENTS

EP 2211381 A1 7/2010

OTHER PUBLICATIONS

INPI Search Report and Written Opinion for priority application, FR Appl. No. 1852593, report dated Nov. 14, 2018, 8 pgs.

*Primary Examiner* — Stephen W Jackson
(74) *Attorney, Agent, or Firm* — Crowe & Dunlevy

(57) ABSTRACT

A protection device includes a first inductive element connecting first and second terminals and a second inductive element connecting third and fourth terminals. A first component includes a first avalanche diode connected in parallel with a first diode string, anodes of the first avalanche diode and a last diode in the string being connected to ground, cathodes of the first avalanche diode and a first diode in the string being connected, and a tap of the first diode string being connected to the first terminal. A second protection component includes a second avalanche diode connected in parallel with a second diode string, anodes of the second avalanche diode and a last diode in the string being connected to ground, cathodes of the second avalanche diode and a first diode in the string being connected, and a tap of the second diode string being connected to the third terminal.

18 Claims, 3 Drawing Sheets

(51) Int. Cl.
  H01L 29/87    (2006.01)
  H01L 29/66    (2006.01)
  H01L 23/60    (2006.01)
  H01L 29/78    (2006.01)
  H01L 29/788   (2006.01)
  H01L 23/522   (2006.01)
  H01L 23/528   (2006.01)
  H01L 27/06    (2006.01)
  H01L 29/06    (2006.01)
  H01L 29/866   (2006.01)
  H02H 9/04     (2006.01)
  H03H 11/04    (2006.01)

(52) U.S. Cl.
  CPC .......... *H01L 23/60* (2013.01); *H01L 27/0255* (2013.01); *H01L 27/0676* (2013.01); *H01L 29/0649* (2013.01); *H01L 29/66113* (2013.01); *H01L 29/7808* (2013.01); *H01L 29/7821* (2013.01); *H01L 29/7886* (2013.01); *H01L 29/866* (2013.01); *H01L 29/87* (2013.01); *H02H 9/046* (2013.01); *H03H 11/04* (2013.01)

(56) References Cited

U.S. PATENT DOCUMENTS

| | | |
|---|---|---|
| 2011/0243120 A1 | 10/2011 | Ginsburg et al. |
| 2014/0363930 A1 | 12/2014 | Bobde |
| 2015/0028460 A1 | 1/2015  | Sharma et al. |
| 2016/0104700 A1 | 4/2016  | Notermans et al. |
| 2017/0373492 A1 | 12/2017 | Ueki |
| 2019/0123556 A1 | 4/2019  | Fang et al. |
| 2021/0143774 A1* | 5/2021 | Cummings ............ H02S 40/38 |

* cited by examiner

PROTECTION AGAINST ELECTROSTATIC DISCHARGES AND FILTERING

CROSS REFERENCE TO RELATED APPLICATIONS

This application is a continuation of U.S. patent application Ser. No. 16/359,431, filed Mar. 20, 2019, which claims the priority benefit of French Application for Patent No. 1852593, filed on Mar. 26, 2018, the contents of which are hereby incorporated by reference in their entireties to the maximum extent allowable by law.

TECHNICAL FIELD

The present disclosure generally relates to electronic circuits, and more particularly to a device for protection against electrostatic discharges.

BACKGROUND

Some electronic circuits, such as integrated circuits, have to be protected against electrostatic discharges. Such electrostatic discharges risk reaching the circuit terminals, and are capable of damaging the circuit.

It is further desired to protect electronic circuits against electromagnetic disturbances which might reach those electronic circuits and affect their operation, or even damage them.

SUMMARY

Disclosed herein is a protection device, including: a first inductive element connecting a first terminal to a second terminal; a second inductive element connecting a third terminal to a fourth terminal; and a first component for protection against electrostatic discharge. The first component includes a first avalanche diode connected in parallel with a first diode string, with anodes of the first avalanche diode and a last diode in the first diode string being connected to ground, with cathodes of the first avalanche diode and a first diode in the first diode string being connected to one another, and with a tap of the first diode string being connected to the first terminal. The protection device also includes a second component for protection against electrostatic discharge, including a second avalanche diode connected in parallel with a second diode string, with anodes of the second avalanche diode and a last diode in the second diode string being connected to ground, with cathodes of the second avalanche diode and a first diode in the second diode string being connected to one another, and with a tap of the second diode string being connected to the third terminal.

The first diode string may include: a first diode having its cathode connected to the cathode of the first avalanche diode and having its anode connected to the tap; and a second diode having its cathode connected to the tap of the first diode string and its anode connected to ground.

The second diode string may include: a third diode having its cathode connected to the cathode of the second avalanche diode and having its anode connected to the tap; and a second fourth having its cathode connected to the tap of the second diode string and its anode connected to ground.

The first and second avalanche diodes may be Zener diodes or transil diodes.

The first inductive element may include: a first plurality of conductive tracks arranged in different insulator layers so as to be overlaid and be magnetically coupled; and the second inductive element may include a second plurality of conductive tracks arranged in different insulator layers so as to be overlaid and be magnetically coupled.

The first avalanche diode may have: an anode defined by a first semiconductor region; and the first diode of the first diode string may have an anode defined by a second semiconductor region separated from the first semiconductor region by third semiconductor region extending continuously between the first and second semiconductor regions in an unbroken fashion; and wherein the third semiconductor region defines interconnected cathodes of the first and second diodes.

The third semiconductor region may be located on an electrically insulating layer and is delimited by insulating trenches.

The electrically insulating layer may cover a support having an electric resistivity greater than 1,500 Ω/cm.

The first avalanche diode may have an anode defined by a first P-type doped semiconductor region; and the first diode of the first diode string may have an anode defined by a second P-type doped semiconductor region separated from the first P-type doped semiconductor region by an N-type doped semiconductor region extending continuously between the first and second P-type doped semiconductor regions in an unbroken fashion. The N-type doped semiconductor region may define interconnected cathodes of the first and second diodes.

An additional N-type doped semiconductor region may underly the first P-type doped semiconductor region and be more heavily doped than the N-type doped semiconductor region.

The N-type doped semiconductor region may have a doping level sufficiently low such that its electrical resistivity at 25° C. is greater than 100 Ω/cm.

Also disclosed herein is an electronic component, including: first and second semiconductor regions; and a third semiconductor region arranged under the first and second semiconductor regions and extending continuously between the first and second semiconductor regions; wherein the first and third semiconductor regions define electrodes of a first diode; and wherein the second and third semiconductor regions define electrodes of a second diode.

The first semiconductor region may be a P-type doped semiconductor region defining an anode of the first diode; the second semiconductor region may be a P-type doped semiconductor region defining an anode of the second diode; and the third semiconductor region may be an N-type doped semiconductor region defining interconnected cathodes of the first and second diodes.

An additional N-type doped semiconductor region may underly the first semiconductor region and be more heavily doped than the third semiconductor region.

The third semiconductor region may have a doping level sufficiently low such that its electrical resistivity at 25° C. is greater than 100 Ω/cm.

The third semiconductor region may be located on an electrically insulating layer and is delimited by insulating trenches.

The electrically insulating layer may cover a support having an electric resistivity greater than 1,500 Ω/cm.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
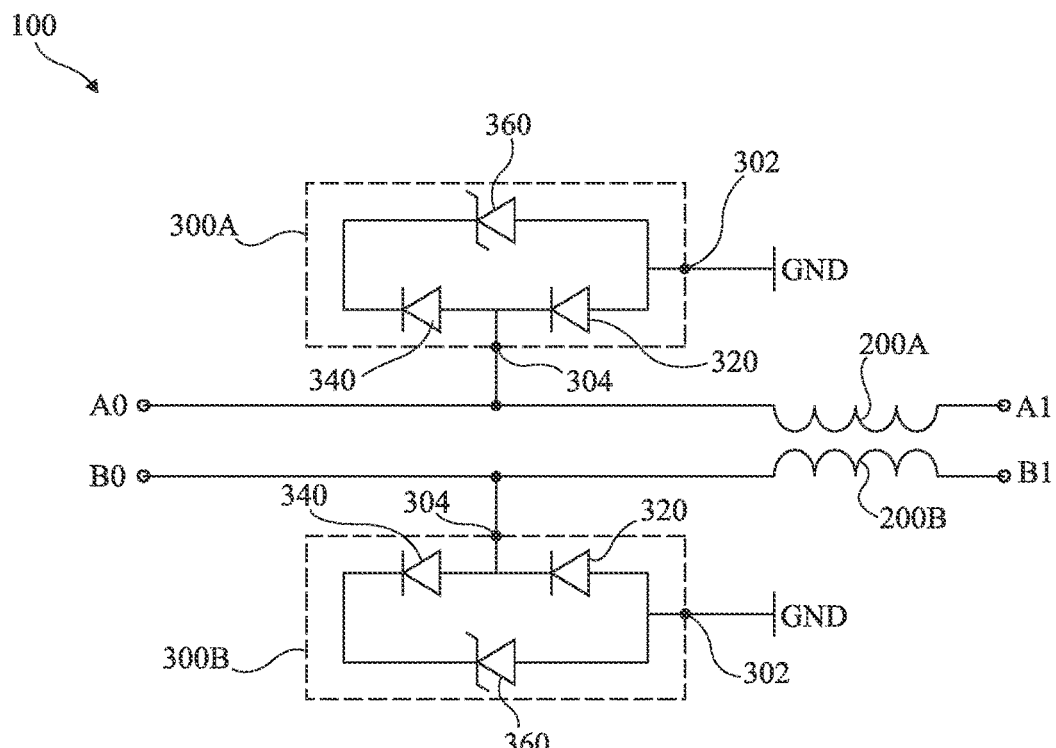
FIG. 1 schematically illustrates a protection and filtering device, comprising two components for protection against electrostatic discharges.

The same elements have been designated with the same reference numerals in the various drawings and, further, the various drawings are not to scale. For clarity, only those steps and elements which are useful to the understanding of the described embodiments have been shown and are detailed. In particular, the electronic circuits to be protected are neither shown, nor detailed, the described embodiments being compatible with current electronic circuits utilizing protection against electrostatic discharges.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the concerned element in the cross-section views, it being understood that, in practice, the described devices may be oriented differently. Unless otherwise specified, expressions "approximately", "substantially", and "in the order of" mean to within 10%, preferably to within 5%.

In the present description, the term "connected" designates a direct electric connection between two elements, while the term "coupled", when it relates to an electric connection, designates an electric connection between two elements which may be direct or via one or a plurality of passive or active components, such as resistors, capacitors, inductances, diodes, transistors, etc.

FIG. 1 schematically illustrates a device 100 for protection against electrostatic discharges and for filtering of electromagnetic disturbances.

Device 100 comprises two input terminals A0 and B0 and two output terminals A1 and B1. Terminals A1 and B1 are connected to an electronic circuit to be protected.

Device 100 comprises two inductive elements 200A and 200B. Inductive element 200A couples terminal A1 to terminal A0. Inductive element 200B couples terminal B1 to terminal B0. Inductive elements 200A and 200B are magnetically coupled and thus form a transformer. The transformation ratio of the transformer is preferably on the order of one, preferably equal to 1.

In operation, inductive elements 200A and 200B block common-mode electromagnetic disturbances. Inductive elements 200A and 200B enable to conduct toward the electronic circuit signals defined by differential modes between terminals A0 and B0. Device 100 plays the role of a common-mode filter (CMF).

Device 100 further comprises two components 300A and 300B for protection against electrostatic discharges. Components 300A and 300B respectively couple terminals A0 and B0 to a node of application of a reference potential, for example, a ground GND.

Each of components 300A and 300B comprises a node 304 and a node 302. Node 304 is connected to the considered terminal A0 or B0. Node 302 is, for example, connected to ground. In each protection component, a diode 320 has its cathode coupled to node 304 and its anode coupled to node 302. In parallel with diode 320, a diode 340 and a diode 360 in series couple node 304 to node 302. Diodes 340 and 360 have their cathodes interconnected, and their anodes respectively connected to nodes 304 and 302. Diode 360 is an avalanche diode, for example, a Zener diode, or a "Transil"-type (transient-voltage-suppression) diode. Such a diode is designed to have an avalanche voltage, for example, of a value smaller than 30 V, preferably smaller than 10 V.

Device 100 is provided so that in normal operation, the potentials of terminals A0 and B0 are positive. In the occurrence of an electrostatic discharge tending to increase the potential of terminal A0 or B0, the discharge is drained off to ground by diodes 340 and 360. In the case of an electrostatic discharge tending to make the potential of terminal A0 or B0 negative, the discharge is drained off to ground by diode 320.

Figure 2:
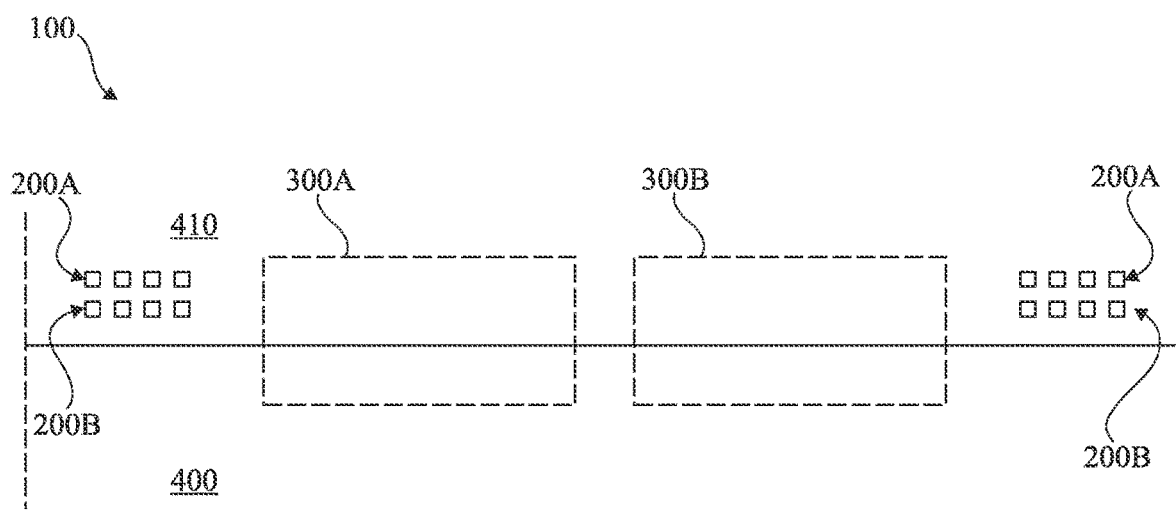
FIG. 2 is a simplified cross-section view of the device of FIG. 1.

FIG. 2 is a simplified cross-section view of the device of FIG. 1. Components 300A and 300B are formed inside and on top of a substrate 400, for example, a wafer of a semiconductor such as silicon. Inductive elements 200A and 200B each comprise a conductive track arranged in insulator layers 410, not shown in detail, covering substrate 400. The track of each inductive element, for example, runs several times, four turns being shown as an example. The inductive elements 200A, 200B may be disposed around the location of the components 300A and 300B, or preferably outside the location of the components 300A and 300B. The tracks of the inductive elements are stacked, which provides the magnetic coupling between these elements. The various connections, not shown, between inductive elements 200A, 200B and components 300A, 300B are typically formed by conductive tracks in insulator layers 410.

Figure 3:
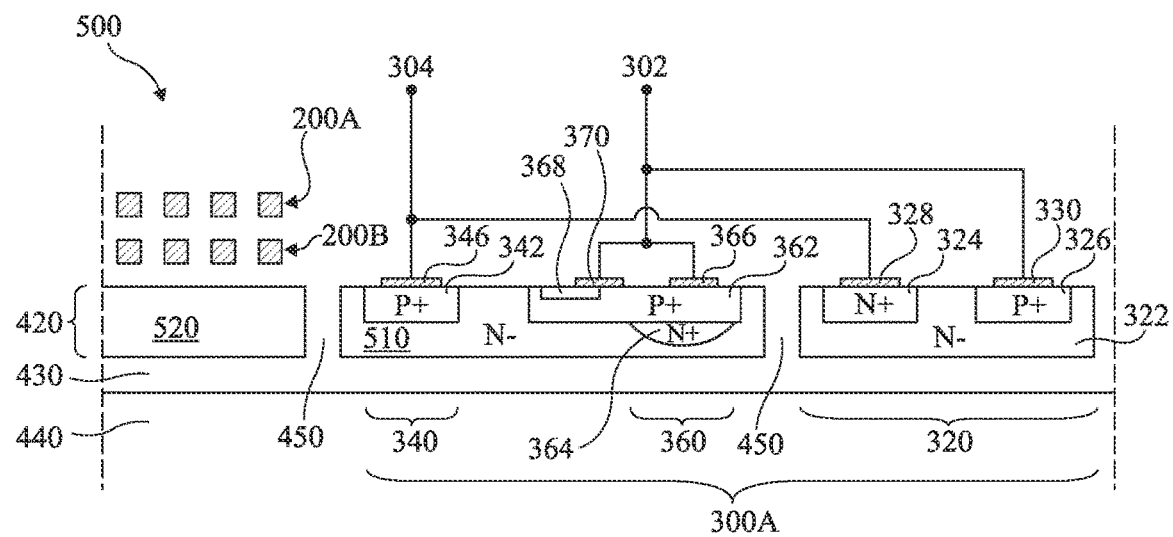
FIG. 3 is a simplified cross-section view illustrating a portion of an embodiment of a filtering device ensuring protection against electrostatic discharges.

FIG. 3 is a simplified cross-section view illustrating a portion of an embodiment of a device 500 for protection against electrostatic discharges of the type of device 100 of FIGS. 1 and 2. FIG. 3 corresponds to an enlargement of the left-hand portion of FIG. 2. In particular, device 500 comprises inductive elements 200A and 200B and components 300A and 300B of the above-described type. Only component 300A is shown and detailed hereafter, since component 300B may be similar to component 300A, for example, symmetrical.

A P-type doped semiconductor region 342 defines the anode of diode 340. A P-type doped semiconductor region 362 defines the anode of avalanche diode 360. A semiconductor region 510, for example, of type N, common to the two diodes 340 and 360, defines the interconnected cathodes of diodes 340 and 360.

Regions 342 and 362 are separate and located in the upper portion of semiconductor region 510. Regions 342 and 362 are thus located on the side of a same surface of semiconductor region 510, a portion of semiconductor region 510 extending between regions 342 and 362. Avalanche diode 360 may comprise a region 364 more heavily N-type doped than region 510, for example, located under region 362. Regions 342 and 362 are, for example, topped with respective contacts 346 and 366 connecting regions 342 and 362 respectively to nodes 304 and 302.

Such a layout of the semiconductor regions defining diode 340 and avalanche diode 360 enables limiting of the stray capacitance of the series coupling, in particular when region 510 is depleted in normal operation. Such a stray capacitance may be low, for example, smaller than 0.3 pF, even for large surface areas of regions 342 and 362, for example, greater than 15,000 µm². Thereby, device 500 enables coupling output terminals A1 and B1 to a signal having a particularly high frequency, for example, greater than 3 GHz. Further, decreasing the stray capacitance enables increasing of the rapidity of the device during the occurrence of an electrostatic discharge. Further, the device enables to drain off to ground currents of high intensities, for example, greater than 10 A, which enables reinforcement of the protection level during the occurrence of an electrostatic discharge.

As an example, semiconductor region 510 has a low N type doping level, for example, so that its electric resistivity at 25° C. is greater than 100 Ω·cm.

Semiconductor region 510 is, for example, a portion of a semiconductor layer 420 on top of and in contact with an insulating layer 430. Insulating layer 430 covers and is, for example, in contact with a support 440. Region 510 is delimited by insulating trenches 450 filled with an electric insulator, for example, silicon oxide. The device can then be obtained from a structure of semiconductor-on-insulator type, for example, of silicon-on-insulator or SOI type comprising support 440, insulating layer 430, for example, made of silicon oxide, and layer 420. As an example, the thickness of layer 420 is in the range from 1 to 15 µm, preferably in the order of 10 µm. The thickness of layer 430 is, for example, in the range from 0.2 µm to 2 µm.

Preferably, support 440 is electrically insulating, for example, made of silicon oxide or of sapphire, or of a semiconductor of high resistivity, for example, greater than 1,500 Ω·cm.

Region 510 may then be depleted in operation across its entire thickness under the region 342, which limits the stray capacitance of the series coupling of diodes 340 and 360. Further, the provision of an electrically insulating or high-resistivity support enables to limit the stray capacitances between the series coupling of the diodes and support 440. This enables the device to couple signals up to particularly high frequencies, and ensures the rapidity of the device during the occurrence of an electrostatic discharge.

It should further be noted that problems of exodiffusion of dopant atoms which would risk occurring from the support if the support was made of a doped semiconductor which would be less resistive than a semiconductor of high resistivity are avoided.

An N-type doped region 368 may be provided in the upper portion of region 362. Region 368 is, for example, located outside of the portion of region 362 covered with contact 366. Region 368 is, for example, located in a portion of region 362 located on the side of region 342. Region 368 is, for example, not located above region 364. Region 368 is, for example, more heavily doped than region 362. A contact 370 covers both a portion of region 368 and a portion of region 362 and electrically couples the two regions to node 302.

A Schockley diode has thus been defined by regions 342 (P), 510 (N), 362 (P), and 368 (N). During the occurrence of an electrostatic discharge, the Schockley diode starts conducting, which enables providing a higher protection level than in the absence of doped region 368. Further, this enables draining an electrostatic discharge to ground without this discharge being absorbed by the association in series of diodes 340 and 360. The risk of these diodes being damaged by the discharge is thus avoided.

In the right-hand portion of FIG. 3, diode 320 of device 300 comprises, as an example, an N-type region, or area 322 of low doping level, for example, of same resistivity as region 510. Separate N-type regions or areas 324 and P-type regions 326 more heavily doped than region 322 are located in the upper portion of region 322. Regions 324 and 326 are, for example, topped with respective contacts 328 and 330 connecting regions 324 and 326 respectively to nodes 304 and 302.

As an example, for a structure of semiconductor-on-insulator type comprising layers 430 and 420 on support 440, regions 510 and 322 are preferably portions of semiconductor layer 420.

The layout of the regions defining diode 320 enables, due to the fact that region 322 may be depleted in normal operation, limitation of the stray capacitance of diode 320. Further, the provision of an electrically-insulating or high-resistivity support 440 enables limiting stray capacitances between the diode and the support.

In the left-hand portion of FIG. 3, stacked inductive elements 200A and 200B are as an example arranged on a portion 520 of semiconductor layer 420. Portion 520 is located on insulating layer 430 and, for example, has a low N-type doping level. Portion 520 is, for example, of same resistivity as region 510 and originates from the same semiconductor layer 420 of a semiconductor-on-insulator structure.

The provision, under the stacked inductive elements, of region 520 of high electric resistivity, of insulator 430, and of electrically-conductive or high-resistivity support 440, enables limiting the stray capacitance between the inductive elements and the support. The device 500 couples signals in differential mode and blocks common-mode electromagnetic disturbances up to high frequencies, for example, greater than 3 GHz.

Figure 4:
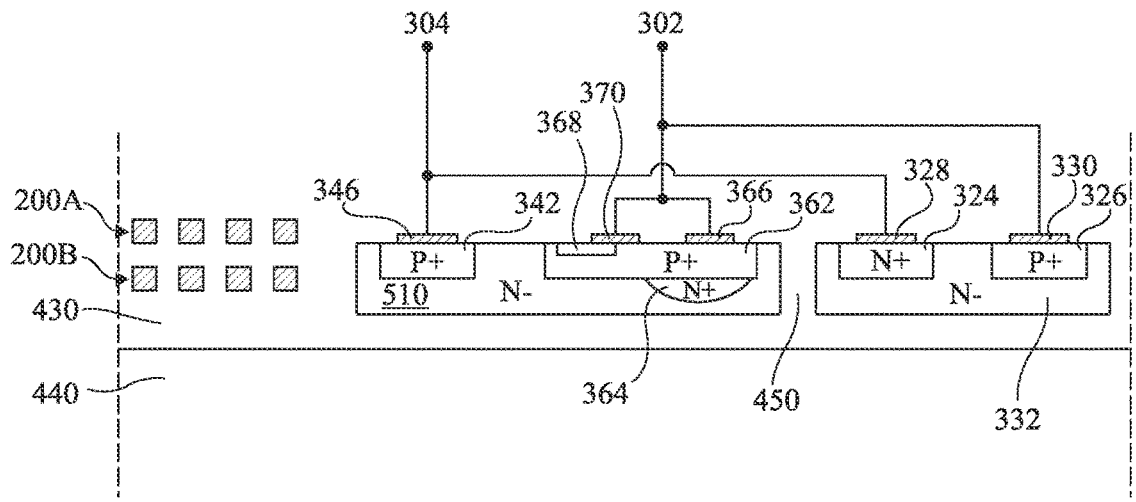
FIG. 4 is a simplified cross-section view illustrating a portion of an alternative embodiment of the device of FIG. 3.

FIG. 4 is a simplified cross-section view illustrating a portion of an alternative embodiment of the device of FIG. 3. In the variation of FIG. 4, portion 520 of semiconductor layer 420 has been removed. A step of etching of this portion may, for example, be provided. This leads to an absence of a semiconductor portion between the inductive elements 200A and 200B and the insulating layer 430 of the SOI structure. The inductive elements are located on electric insulators only, or on electric insulators and the high resistivity support 440 only. As a result, the device 500 couples signals in differential mode and blocks common-mode electromagnetic disturbances up to particularly high frequencies.

Figure 5:
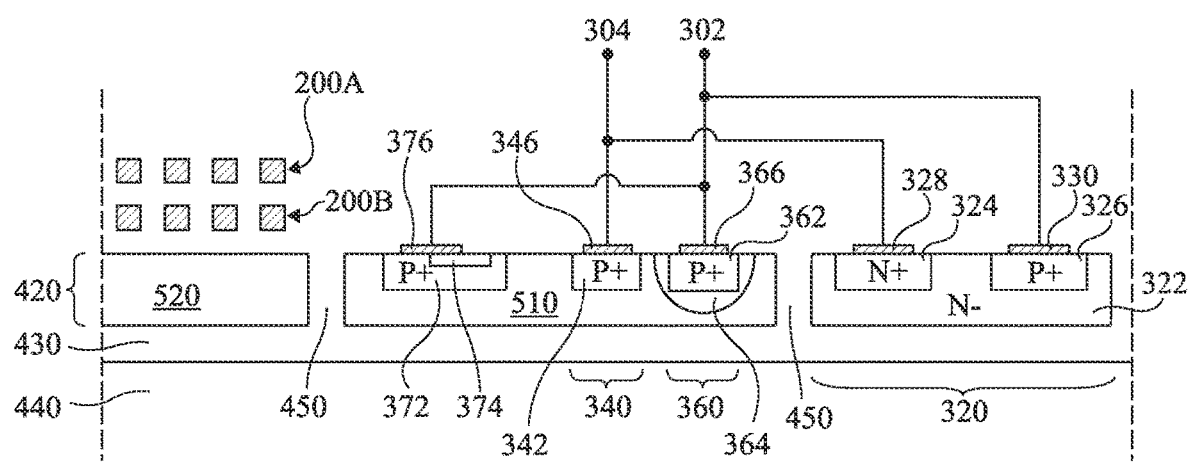
FIG. 5 is a simplified cross-section view illustrating a portion of another alternative embodiment of the device of FIG. 3.

FIG. 5 is a simplified cross-section view illustrating another embodiment of the device of FIG. 3. The device of FIG. 5 differs from the device of FIG. 3 in that the region 510 further extends under and between a P-type doped region 372 and the P-type doped region 342 of the diode 340, the region 368 is replaced by an N-doped region 374 located in an upper portion of the region 372, preferably on the side closest to the region 342, and the contact 370 is replaced by a contact 376, covering both a portion of the region 372 and a portion of the region 374, and electrically coupling both regions 372 and 376 to the node 302.

As an example, the N-type region 364 is located under and around the region 362.

The regions 342 (P), 510 (N), 372 (P) and 374 (N) thus define a Schockley diode that replaces and plays the role of the Schockley diode of the device of FIG. 3. The protection level provided by the device of FIG. 5 is higher than the protection level provided by the device of FIG. 3.

Specific embodiments have been described. Various alterations, modifications, and improvements will occur to those skilled in the art. In particular, a single protection component of the type of component 300A coupling a terminal to ground, and providing protection against electrostatic discharges reaching this terminal may be provided. A filtering inductive element similar to element 200A may then be provided. Further, diode 320 may be replaced with any diode adapted to the protection against electrostatic discharges.

Further, the doping types may be exchanged in components 300A and/or 300B. The sign of the voltages and the connection direction of components 300A and/or 300B between terminals A0 and/or B0 and the ground may then be modified.

Various embodiments with various variations have been described hereabove. It should be noted that those skilled in the art may combine various elements of these various embodiments and variations without showing any inventive step.

Finally, the practical implementation of the described embodiments is within the abilities of those skilled in the art based on the functional indications given hereabove.

The invention claimed is:

1. A protection device, comprising:
   a first inductive element connecting a first terminal to a second terminal;
   a second inductive element connecting a third terminal to a fourth terminal;
   a first component for protection against electrostatic discharge, comprising:
      a first avalanche diode connected in parallel with a first diode string, with anodes of the first avalanche diode and a last diode in the first diode string being connected to a reference voltage node, with cathodes of the first avalanche diode and a first diode in the first diode string being connected to one another, and with a tap of the first diode string being connected to the first terminal; and
   a second component for protection against electrostatic discharge, comprising:
      a second avalanche diode connected in parallel with a second diode string, with anodes of the second avalanche diode and a last diode in the second diode string being connected to the reference voltage node, with cathodes of the second avalanche diode and a first diode in the second diode string being connected to one another, and with a tap of the second diode string being connected to the third terminal.

2. The protection device of claim 1, wherein the first diode string comprises: a first diode having its cathode connected to the cathode of the first avalanche diode and having its anode connected to the tap of the first diode string; and a second diode having its cathode connected to the tap of the first diode string and its anode connected to the reference voltage node.

3. The protection device of claim 1, wherein the second diode string comprises: a third diode having its cathode connected to the cathode of the second avalanche diode and having its anode connected to the tap of the second diode string; and a second fourth having its cathode connected to the tap of the second diode string and its anode connected to the reference voltage node.

4. The protection device of claim 1, wherein the first and second avalanche diodes are Zener diodes.

5. The protection device of claim 1, wherein the first and second avalanche diodes are transil diodes.

6. The protection device of claim 1, wherein the first inductive element comprises a first plurality of conductive tracks arranged in insulation, wherein the second inductive element comprises a second plurality of conductive tracks arranged in insulation, and wherein the first plurality of conductive tracks and second plurality of conductive tracks are overlaid and magnetically coupled.

7. The protection device of claim 1, wherein the first avalanche diode has an anode defined by a first semiconductor region; wherein the first diode of the first diode string has an anode defined by a second semiconductor region separated from the first semiconductor region by third semiconductor region extending continuously between the first and second semiconductor regions in an unbroken fashion; and wherein the third semiconductor region defines interconnected cathodes of the first diode of the first diode string and the first avalanche diode.

8. The protection device of claim 7, wherein the third semiconductor region is located on an electrically insulating layer and is delimited by insulating trenches.

9. The protection device of claim 8, wherein the electrically insulating layer covers a support having an electric resistivity greater than 1,500 Ω/cm.

10. The protection device of claim 1, wherein the first avalanche diode has an anode defined by a first P-type doped semiconductor region; wherein the first diode of the first diode string has an anode defined by a second P-type doped semiconductor region separated from the first P-type doped semiconductor region by an N-type doped semiconductor region extending continuously between the first and second P-type doped semiconductor regions in an unbroken fashion; and wherein the N-type doped semiconductor region defines interconnected cathodes of the first diode of the first diode string and the first avalanche diode.

11. The protection device of claim 10, further comprising an additional N-type doped semiconductor region underlying the first P-type doped semiconductor region and being more heavily doped than the N-type doped semiconductor region.

12. The protection device of claim 11, wherein the N-type doped semiconductor region has a doping level sufficiently low such that its electrical resistivity at 25° C. is greater than 100 Ω/cm.

13. An electronic component, comprising:
   first and second semiconductor regions; and
   a third semiconductor region arranged under the first and second semiconductor regions and extending continuously between the first and second semiconductor regions;
   wherein the first and third semiconductor regions define electrodes of a first diode; and
   wherein the second and third semiconductor regions define electrodes of a second diode.

14. The electronic component of claim 13, wherein the first semiconductor region comprises a P-type doped semiconductor region defining an anode of the first diode; wherein the second semiconductor region comprises a P-type doped semiconductor region defining an anode of the second diode; and wherein the third semiconductor region comprises an N-type doped semiconductor region defining interconnected cathodes of the first and second diodes.

15. The electronic component of claim 14, further comprising an additional N-type doped semiconductor region underlying the first semiconductor region and being more heavily doped than the third semiconductor region.

16. The electronic component of claim 15, wherein the third semiconductor region has a doping level sufficiently low such that its electrical resistivity at 25° C. is greater than 100 Ω/cm.

17. The electronic component of claim 13, wherein the third semiconductor region is located on an electrically insulating layer and is delimited by insulating trenches.

18. The electronic component of claim 17, wherein the electrically insulating layer covers a support having an electric resistivity greater than 1,500 Ω/cm.

* * * * *